(12) United States Patent  
Guo et al.

(10) Patent No.: US 9,018,874 B2  
(45) Date of Patent: Apr. 28, 2015

(54) CIRCUIT FOR FILTERING NARROW PULSE AND COMPENSATING WIDE PULSE, AND MOTOR CONTROLLER COMPRISING THE CIRCUIT

(71) Applicant: Broad-Ocean Motor EV Co., Ltd., Beijing (CN)

(72) Inventors: Yuefei Guo, Beijing (CN); Zhouping Lin, Beijing (CN); Chong Yu, Beijing (CN); Jun Kang, Beijing (CN); Kun Cheng, Beijing (CN)

(73) Assignee: Broad-Ocean Motor EV Co., Ltd., Beijing (CN)

( * ) Notice: Subject to any disclaimer, the term of this patent is extended or adjusted under 35 U.S.C. 154(b) by 151 days.

(21) Appl. No.: 13/845,058

(22) Filed: Mar. 17, 2013

(65) Prior Publication Data

US 2013/0214715 A1 Aug. 22, 2013

Related U.S. Application Data

(63) Continuation-in-part of application No. PCT/CN2011/085119, filed on Dec. 31, 2011.

(51) Int. Cl.
*H02P 6/14* (2006.01)
*H03K 3/017* (2006.01)
*H02P 27/08* (2006.01)
*H02M 1/32* (2007.01)
*H02M 7/5387* (2007.01)
*H02M 7/5395* (2006.01)

(52) U.S. Cl.
CPC ............... *H03K 3/017* (2013.01); *H02P 27/08* (2013.01); *H02M 1/32* (2013.01); *H02M 7/53875* (2013.01); *H02M 7/5395* (2013.01)

(58) Field of Classification Search
USPC ............ 318/400.1, 400.26, 599; 327/76.276, 327/175
See application file for complete search history.

(56) References Cited

U.S. PATENT DOCUMENTS

| | | | | |
|---|---|---|---|---|
| 3,740,586 A | * | 6/1973 | Banks et al. | 327/31 |
| 3,968,449 A | * | 7/1976 | Dunnam | 327/172 |
| 3,979,605 A | * | 9/1976 | Fukaya | 348/529 |
| 4,114,117 A | * | 9/1978 | Ford | 333/173 |
| 4,295,082 A | * | 10/1981 | Moto et al. | 318/599 |
| 4,471,235 A | * | 9/1984 | Sakhuja et al. | 327/34 |
| 4,576,253 A | * | 3/1986 | Tanahashi et al. | 187/296 |
| 4,591,736 A | * | 5/1986 | Hirao et al. | 327/91 |
| 4,600,866 A | * | 7/1986 | Seto | 388/809 |
| 4,939,395 A | * | 7/1990 | Asano et al. | 327/513 |
| 5,065,625 A | * | 11/1991 | Nakagawa et al. | 73/335.02 |
| 5,706,186 A | * | 1/1998 | Blasko | 363/41 |
| 5,708,375 A | * | 1/1998 | Lemmens | 327/36 |
| 5,760,839 A | * | 6/1998 | Sumiyoshi | 348/541 |

(Continued)

OTHER PUBLICATIONS

Pulse Width Modulation (PWM) Tutorial by John Massa, Copy right 2005 by Datadog Systems.*

*Primary Examiner* — Paul Ip  
(74) *Attorney, Agent, or Firm* — Matthias Scholl P.C.; Matthias Scholl

(57) ABSTRACT

A circuit for filtering narrow pulse and compensating wide pulse, including a signal shaping circuit, a filter circuit, and a pulse width compensating circuit. The signal shaping circuit processes an input signal and transmits the input signal to the filter circuit. The filter circuit filters off narrow pulses of the input signal. The pulse width compensating circuit compensates the wide pulses of the input signal and outputs an output signal.

4 Claims, 5 Drawing Sheets

(56) References Cited

U.S. PATENT DOCUMENTS

| | | | |
|---|---|---|---|
| 5,774,505 A * | 6/1998 | Baugh | 375/348 |
| 5,995,710 A * | 11/1999 | Holling et al. | 388/811 |
| 6,002,380 A * | 12/1999 | Lee | 345/13 |
| 6,060,922 A * | 5/2000 | Chow et al. | 327/175 |
| 6,091,940 A * | 7/2000 | Sorrells et al. | 455/118 |
| 6,239,991 B1 * | 5/2001 | Ajro et al. | 363/41 |
| 6,288,953 B1 * | 9/2001 | Kwak | 365/189.05 |
| 6,323,712 B1 * | 11/2001 | Shih | 327/276 |
| 6,529,046 B1 * | 3/2003 | Shih | 327/34 |
| 6,538,484 B1 * | 3/2003 | Rappaport et al. | 327/172 |
| 6,542,722 B1 * | 4/2003 | Sorrells et al. | 455/110 |
| 6,657,412 B2 * | 12/2003 | Ishida et al. | 318/599 |
| 6,833,736 B2 * | 12/2004 | Nakazato et al. | 327/34 |
| 7,119,530 B2 * | 10/2006 | Mir et al. | 324/76.15 |
| 7,123,829 B2 * | 10/2006 | Ohsuga | 396/301 |
| 7,145,398 B2 * | 12/2006 | Dalton et al. | 331/1 A |
| 7,283,738 B2 * | 10/2007 | Ohsuga | 396/303 |
| 7,764,089 B2 * | 7/2010 | Iwabuchi et al. | 327/108 |
| 8,085,022 B2 * | 12/2011 | Chen et al. | 323/282 |
| 8,195,053 B2 * | 6/2012 | Watanabe | 398/159 |
| 8,378,528 B2 * | 2/2013 | Jang et al. | 307/135 |
| 2002/0041618 A1 * | 4/2002 | Watanabe et al. | 372/76 |
| 2002/0093391 A1 * | 7/2002 | Ishida et al. | 332/109 |
| 2004/0005153 A1 * | 1/2004 | Watanabe | 398/148 |
| 2004/0136714 A1 * | 7/2004 | Shahar et al. | 398/82 |
| 2004/0155688 A1 * | 8/2004 | Nakazato et al. | 327/172 |
| 2004/0179841 A1 * | 9/2004 | Shahar | 398/75 |
| 2004/0208571 A1 * | 10/2004 | Shahar et al. | 398/79 |
| 2005/0041444 A1 * | 2/2005 | Inoue | 363/56.02 |
| 2005/0053329 A1 * | 3/2005 | Shahar | 385/27 |
| 2005/0053333 A1 * | 3/2005 | Shahar | 385/48 |
| 2005/0057290 A1 * | 3/2005 | Dalton et al. | 327/156 |
| 2005/0062879 A1 * | 3/2005 | Ohsuga | 348/372 |
| 2005/0087688 A1 * | 4/2005 | Yokogawa et al. | 250/338.1 |
| 2005/0111500 A1 * | 5/2005 | Harter et al. | 372/25 |
| 2005/0134343 A1 * | 6/2005 | Goto et al. | 327/175 |
| 2005/0207761 A1 * | 9/2005 | Ikeuchi | 398/198 |
| 2005/0215207 A1 * | 9/2005 | Sorrells et al. | 455/114.1 |
| 2006/0176059 A1 * | 8/2006 | Mir et al. | 324/503 |
| 2006/0204172 A1 * | 9/2006 | Shahar | 385/27 |
| 2007/0003271 A1 * | 1/2007 | Ohsuga | 396/303 |
| 2007/0029958 A1 * | 2/2007 | Clermonts | 318/432 |
| 2007/0127604 A1 * | 6/2007 | Inoue et al. | 375/341 |
| 2007/0268957 A1 * | 11/2007 | Kovacevich | 374/179 |
| 2008/0074773 A1 * | 3/2008 | Izumi | 360/51 |
| 2008/0084196 A1 * | 4/2008 | Lacombe et al. | 323/282 |
| 2008/0186076 A1 * | 8/2008 | Kawama | 327/336 |
| 2008/0272744 A1 * | 11/2008 | Melanson | 323/205 |
| 2008/0297122 A1 * | 12/2008 | Zhou et al. | 323/222 |
| 2008/0298784 A1 * | 12/2008 | Kastner | 388/811 |
| 2009/0027028 A1 * | 1/2009 | Ting | 323/288 |
| 2009/0027118 A1 * | 1/2009 | Andersen et al. | 330/10 |
| 2009/0289708 A1 * | 11/2009 | Beale et al. | 330/149 |
| 2010/0166426 A1 * | 7/2010 | Watanabe | 398/81 |
| 2011/0101929 A1 * | 5/2011 | Maedako et al. | 322/24 |
| 2011/0299638 A1 * | 12/2011 | Gauthier | 375/343 |
| 2012/0217907 A1 * | 8/2012 | Sakaguchi | 318/400.1 |
| 2012/0249184 A1 * | 10/2012 | Tuten et al. | 327/34 |
| 2013/0120075 A1 * | 5/2013 | Katou | 332/109 |
| 2013/0141148 A1 * | 6/2013 | Ishii et al. | 327/174 |
| 2013/0265024 A1 * | 10/2013 | Chen | 323/282 |
| 2013/0293211 A1 * | 11/2013 | Chen | 323/282 |

* cited by examiner

CIRCUIT FOR FILTERING NARROW PULSE AND COMPENSATING WIDE PULSE, AND MOTOR CONTROLLER COMPRISING THE CIRCUIT

CROSS-REFERENCE TO RELATED APPLICATIONS

This application is a continuation-in-part of International Patent Application No. PCT/CN2011/085119 with an international filing date of Dec. 31, 2011, designating the United States, now pending, the contents of which are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a circuit for filtering narrow pulse and compensating wide pulse.

2. Description of the Related Art

As shown in FIG. 1, a typical permanent magnet synchronous motor controller includes a PWM signal generator, an inverter unit, and a motor body (M). The motor body (M) includes a permanent magnet rotor, a stator, and windings (U, V, and W). The PWM signal generator can adopt a micro controller unit (MCU) or a special integrated circuit chip IC, and generate pulse signals of a certain width, so that the insulated gate bipolar transistors IGBT (Q1, Q2, Q3, Q4, Q5, and Q6) of the inverter unit are conducted by turns, and the windings (U, V, and W) are powered on by turns.

During the treatment process of the conventional motor controller, driving signals used for controlling the IGBT and calculated through the PWM signal generator (i.e., micro controller unit (MCU)) under the action of modulation and demodulation from software include narrow pulses. The narrow pulses have negative effects on the IGBT (Insulated Gate Bipolar Transistor). As shown in FIG. 2, before the PWM signal generator generates normal drive pulses B, a plurality of narrow pulses will be generated. These narrow pulses A will be closed immediately before the complete opening of the IGBT, the IGBT will be overheated, thus the service life will be affected, the IGBT will be destroyed after a long time of use, even the IGBT will be burned out, and the negative impact to motor control will be caused. Therefore, the modulated pulses are required to be treated.

SUMMARY OF THE INVENTION

In view of the above-described problems, it is one objective of the invention to provide a circuit for filtering narrow pulse and compensating wide pulse. The circuit can filter off narrow pulses of an input signal and allow normal pulses to pass completely.

To achieve the above objective, in accordance with one embodiment of the invention, there is provided a circuit for filtering narrow pulse and compensating wide pulse, comprising a signal shaping circuit, a filter circuit, and a pulse width compensating circuit. The signal shaping circuit processes an input signal and transmits the input signal to the filter circuit. The filter circuit filters off narrow pulses of the input signal, and wide pulses of the input signal are compensated from the pulse width compensating circuit and output.

In a class of this embodiment, the filter circuit is an RC filter circuit.

In a class of this embodiment, the signal shaping circuit comprises a first Schmitt trigger.

In a class of this embodiment, the pulse width compensating circuit comprises a second Schmitt trigger, a triode, a first resistor, a second resistor, and a capacitor. The input signal processed through the filter circuit is connected with the second Schmitt trigger. The signal is output from an output end of the second Schmitt trigger. The capacitor and the second resistor are connected in series and connected to the output end and a grounded end of the second Schmitt trigger respectively. A node between the capacitor and the second resistor is connected with a base electrode of the triode after being connected with the first resistor. An emitting electrode of the triode is grounded, and a collecting electrode of the triode is connected with an input end of the Second Schmitt trigger.

Advantages of the circuit for filtering narrow pulse and compensating wide pulse are summarized as follows:

(1) the narrow pulses of the input signal can be filtered off, the normal pulses can completely pass, the control is more accurate, and the electronic components for a downstream circuit are protected effectively;

(2) the filter circuit is an RC filter circuit, the signal shaping circuit is a Schmitt trigger, and the two circuits are matched with each other, thus the circuit structure is simple and reasonable, and the narrow pulses can be filtered off effectively; and (3) the pulse width compensating circuit comprises a Schmitt trigger, a triode, a resistor and a capacitor; the circuit structure is simple and reliable, and the manufacturing cost is low.

Another objective of the invention is to provide a motor controller. A circuit for filtering narrow pulse and compensating wide pulse is accessed between the PWM (Pulse-Width Modulation) signal generator and the inverter unit, and can filter off the narrow pulses in a signal input from the PWM signal generator and allow the normal pulses to completely pass. The pulses input into the inverter unit all become normal pulses. Thus, the power element IGBT is protected effectively, and the control is more accurate.

In accordance with another embodiment of the invention, there provided is a motor controller, comprising a PWM signal generator and an inverter unit. The PWM signal generator comprises a plurality of signal output ends, each of the signal output ends being provided with a circuit for filtering narrow pulse and compensating wide pulse, an output end of the circuit for filtering narrow pulse and compensating wide pulse being connected with an input end of the inverter unit. The circuit for filtering narrow pulse and compensating wide pulse comprises a signal shaping circuit, a filter circuit, and a pulse width compensating circuit. The signal shaping circuit processes an input signal and transmits the input signal to the filter circuit. The filter circuit filters off narrow pulses of the input signal, and wide pulses of the input signal are compensated from the pulse width compensating circuit and output.

In a class of this embodiment, the filter circuit is an RC filter circuit.

In a class of this embodiment, the signal shaping circuit comprises a first Schmitt trigger.

In a class of this embodiment, the pulse width compensating circuit comprises a second Schmitt trigger, a triode, a first resistor, a second resistor, and a capacitor. The input signal processed through the filter circuit is connected with the second Schmitt trigger. The signal is output from an output end of the second Schmitt trigger. The capacitor and the second resistor are connected in series and connected to the output end and a grounded end of the second Schmitt trigger respectively. A node between the capacitor and the second resistor is connected with a base electrode of the triode after being connected with the first resistor. An emitting electrode of the triode is grounded, and a collecting electrode of the triode is connected with an input end of the Second Schmitt trigger.

Advantages of the motor controller are summarized as follows:

(1) the circuit for filtering narrow pulse and compensating wide pulse is accessed between the PWM signal generator and the inverter unit, and can filter off the narrow pulses in a signal input from the PWM signal generator and allow the normal pulses to completely pass, and the pulses input into the inverter unit all become normal pulses, thus the power element IGBT is protected effectively, and the control is more accurate;

(2) the filter circuit is an RC filter circuit, the signal shaping circuit is a Schmitt trigger, and the two circuits are matched with each other, thus the circuit structure is simple and reasonable, and the narrow pulses can be filtered off effectively; and (3) the pulse width compensating circuit comprises a Schmitt trigger, a triode, a resistor and a capacitor, the circuit structure is simple and reliable, and the manufacturing cost is low.

DETAILED DESCRIPTION OF THE EMBODIMENTS

The following specific embodiments and drawings aim to serve as the further description for the invention.

Figure 1:
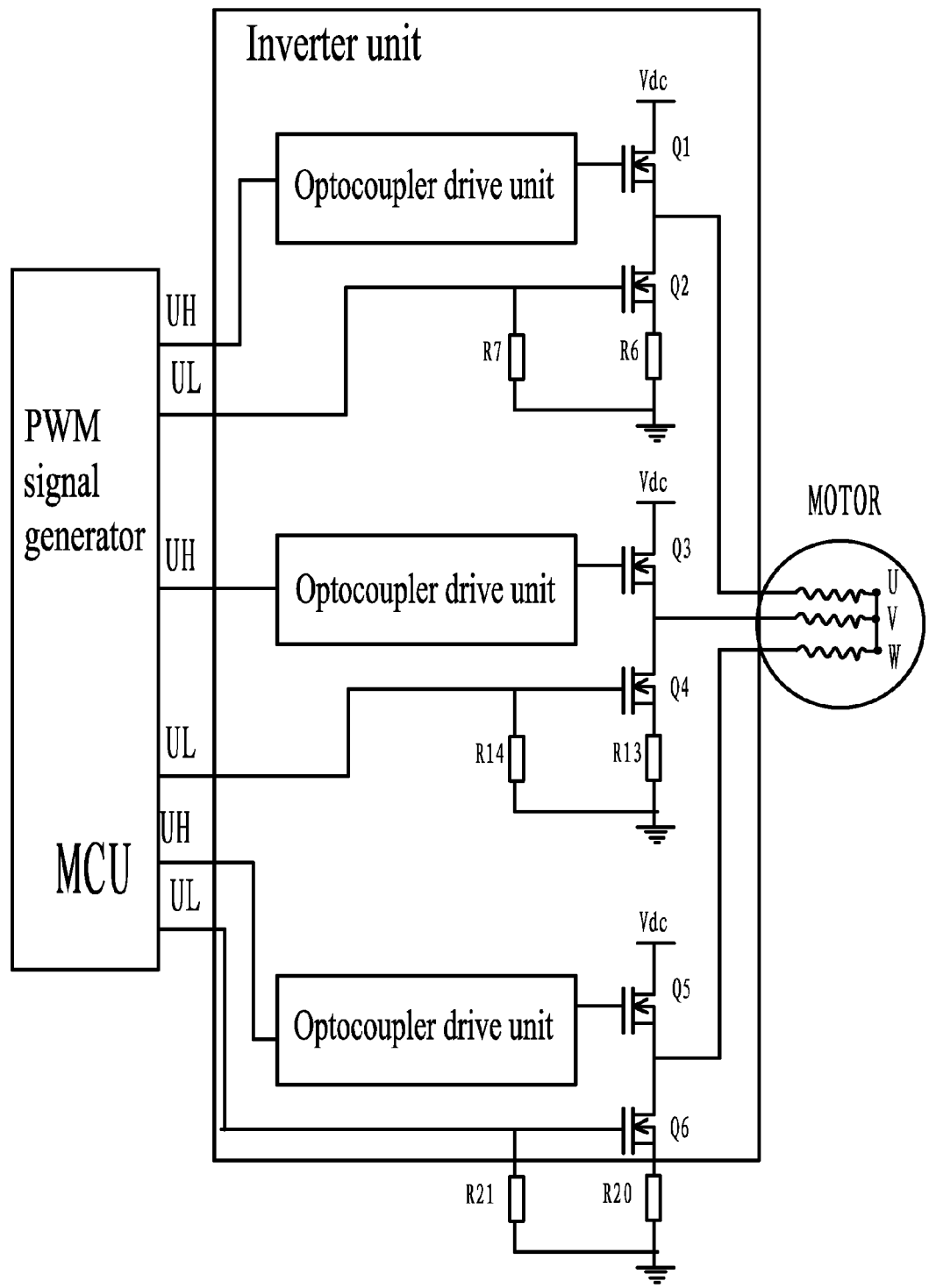
FIG. 1 is a partial functional block diagram of a traditional motor controller.
Figure 2:
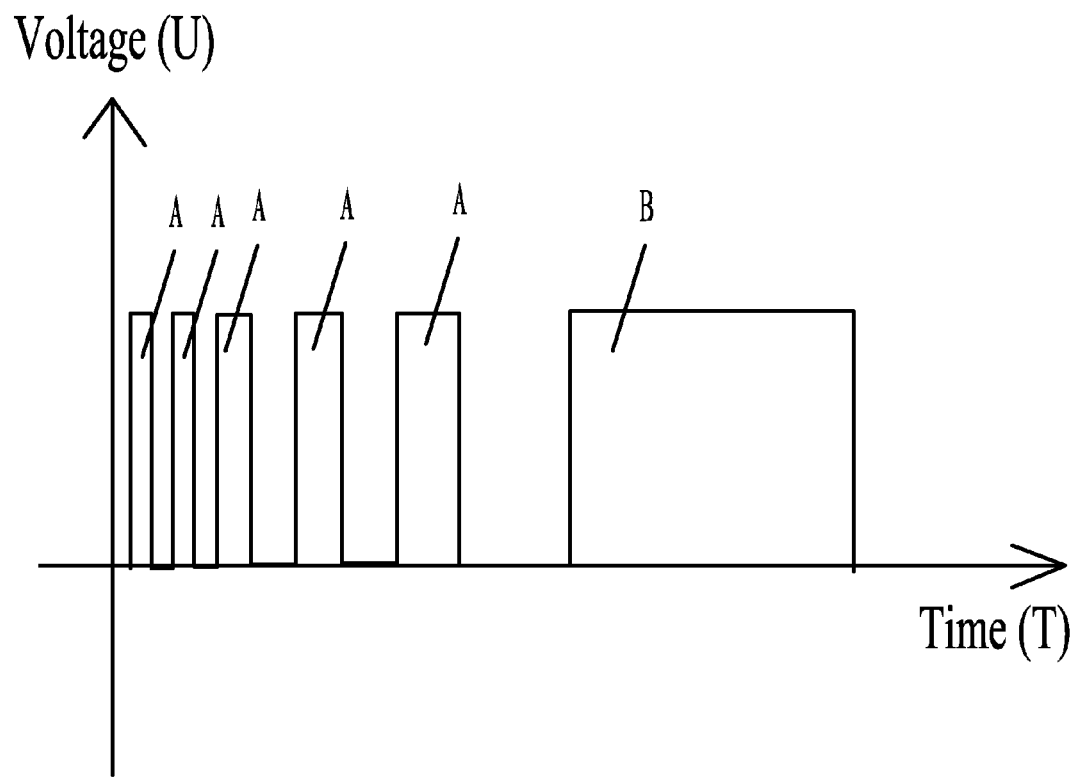
FIG. 2 is a diagram for signals generated from a traditional PWM signal generator.
Figure 3:
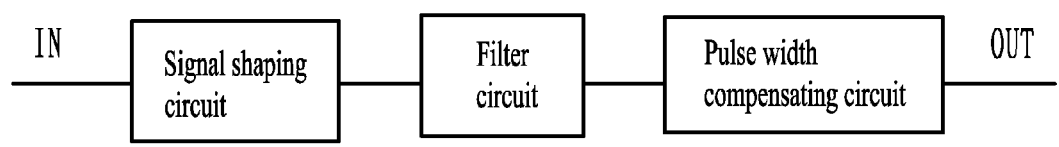
FIG. 3 is a functional block diagram of a circuit for filtering narrow pulse and compensating wide pulse of the invention.
Figure 4:
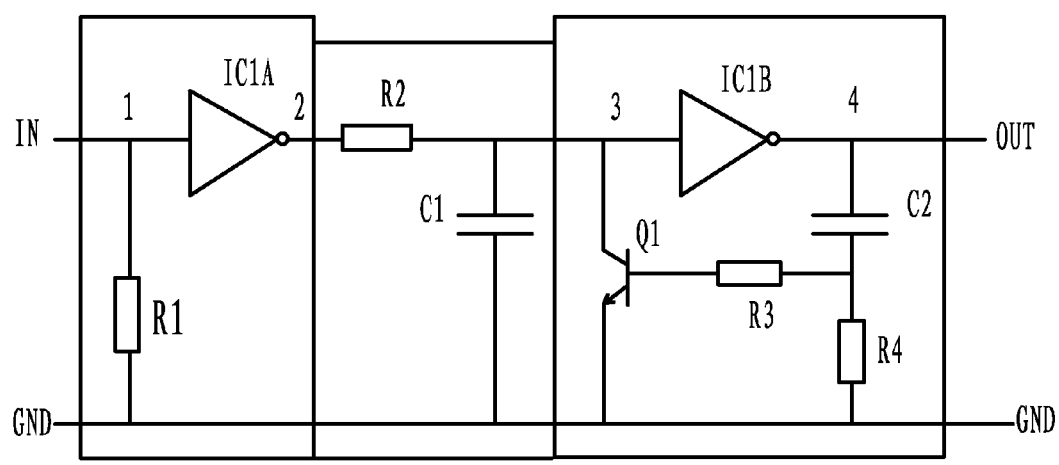
FIG. 4 is a corresponding circuit diagram of FIG. 3.

As shown in FIG. 3 and FIG. 4, a circuit for filtering narrow pulse and compensating wide pulse comprises a signal shaping circuit 1, a filter circuit 2, and a pulse width compensating circuit 3. An input signal processed through the signal shaping circuit 1 is transmitted to the filter circuit 2. The filter circuit 2 filters off the narrow pulses of the input signal, and the wide pulses of the input signal are output after compensation from the pulse width compensating circuit 3. The signal shaping circuit 1 comprises a first Schmitt trigger IC1A and a resistor R1. The resistor R1 is connected between the input end of the first Schmitt trigger IC1A and the ground respectively, and the input signal is connected at the input end of the first Schmitt trigger IC1A. The filter circuit 2 is an RC filter circuit and comprises a resistor R2 and a capacitor C1. The pulse width compensating circuit 3 comprises a second Schmitt trigger IC1B, a triode Q1, a first resistor R3, a second resistor R4 and a capacitor C2. The input signal processed through the filter circuit 2 is connected with the second Schmitt trigger IC1B. The signal is output from the output end of the second Schmitt trigger IC1B, after the capacitor C2 is connected with the second resistor R4 in series, two ends of the capacitor C2 are connected at the output end and the grounded end of the second Schmitt trigger IC1B respectively. A node between the capacitor C2 and the second resistor R4 is connected with a base electrode of the triode Q1 after being connected with the first resistor R3. An emitting electrode of the triode Q1 is grounded, and a collecting electrode of the triode Q1 is connected with the input end of the second Schmitt trigger IC1B. The resistor R2 is connected between the output end of the first Schmitt trigger IC1A and the input end of the second Schmitt trigger IC1B, one end of the capacitor C1 is connected between the resistor R2 and the input end of the second Schmitt trigger IC1B, and the other end of the capacitor C1 is grounded.

The principle of the invention is as follows: as shown in FIG. 3 and FIG. 4, the input signal is driven to enter into the signal shaping circuit 1 from an IN end, and then reaches the filter circuit 2 after shaping and anti jamming processing from the resistor R1 and the first Schmitt trigger IC1A, and it is assumed that the pulse width of the driven input signal at the moment is $T_i$. The resistor R2 and the capacitor C1 constitute a narrow pulse filter circuit, and the width of pulses filtered through the filter circuit is T1, thus the pulse width of the driven input signal to reach the pulse width compensating circuit 3 is $T_i$-T1. When $T_i$-T1≤0, narrow pulses are totally absorbed, and the second Schmitt trigger IC1B outputs low level, that is, the position 4 is in low level. When $T_i$-T1>0, pulses are not totally absorbed, and the second Schmitt trigger IC1B outputs high level, that is, the position 4 is in high level. A triode Q1 in an inverter is conducted. A compensating circuit comprising a triode Q1, a capacitor C2, a first resistor R3 and a second resistor R4 is used for compensating pulses. The width of pulses compensated through the compensating circuit is set as T2. The overall width of the compensated pulses is $T_i$-T1+T2. When the relationship that the pulse width of the signal at the output end OUT is $T_O=T_i$ is met, T1=T2, and it's realized through setting the values of the resistor R2, the capacitor C1, the capacitor C2, the first resistor R3 and the second resistor R4, thus $T_O=T_i$ under the application of the compensating circuit, that is, after the pulse width exceeds the minimum pulse width, the pulses are output in an intact state; the harmless pulses with driving capability are reserved but not the harmful pulses with narrower width, thus the purposes of preventing the IGBT from being overheated and protecting the IGBT are achieved ultimately. For example, when the width of the narrow pulses is smaller than the minimum pulse width T1, it's assumed as 3 microseconds, the assumed width of the narrow pulses of the input signal is only 2 microseconds, then the narrow pulses will be filtered off; if the pulses with width of 3.5 microseconds are contained in the input signal, they will be reversed and output.

Figure 5:
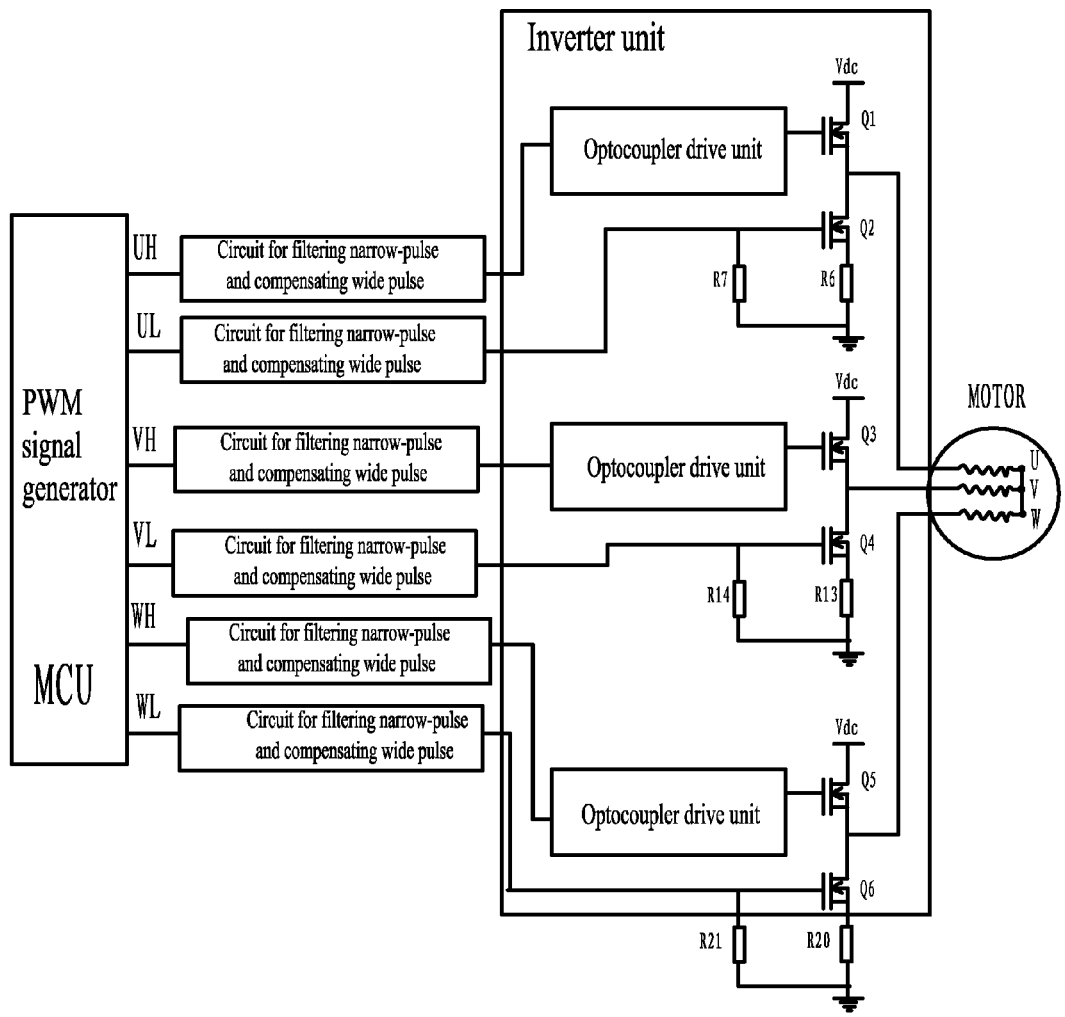
FIG. 5 is a principle diagram of a motor controller of the invention.

As shown in FIG. 3, FIG. 4, and FIG. 5, a motor controller comprises a PWM signal generator and an inverter unit. A circuit for filtering narrow pulse and compensating wide pulse is installed at a plurality of signal output ends of the PWM signal generator, and the output end of the circuit for filtering narrow pulse and compensating wide pulse is connected with the input end of the inverter unit. The circuit for filtering narrow pulse and compensating wide pulse comprises a signal shaping circuit 1, a filter circuit 2 and a pulse width compensating circuit 3. The input signal processed through the signal shaping circuit 1 is transmitted to the filter circuit 2. The filter circuit 2 filters off the narrow pulses of the input signal, and the wide pulses of the input signal are output after compensation from the pulse width compensating circuit 3. The signal shaping circuit 1 comprises a first Schmitt trigger IC1A and a resistor R1. The resistor R1 is connected between the input end of the first Schmitt trigger IC1A and the ground respectively, and the input signal is connected at the input end of the first Schmitt trigger IC1A. The filter circuit 2 is an RC filter circuit and comprises a resistor R2 and a capacitor C1. The pulse width compensating circuit 3 comprises a second Schmitt trigger IC1B, a triode Q1, a first resistor R3, a second resistor R4 and a capacitor C2. The input signal processed through the filter circuit 2 is connected with the second Schmitt trigger IC1B, the signal is output from the output end of the second Schmitt trigger IC1B, after the capacitor C2 is connected with the second resistor R4 in series, two ends of the capacitor C2 are connected at the output end and the grounded end of the second Schmitt trigger IC1B respectively. A node between the capacitor C2 and the second resistor R4 is connected with a base electrode of a triode Q1 after being connected with the first resistor R3. An emitting electrode of the triode Q1 is grounded. A collecting electrode of the triode Q1 is connected with the input end of the second Schmitt trigger IC1B. The resistor R2 is connected between the output end of the first Schmitt trigger IC1A and the input end of the second Schmitt trigger IC1B. One end of the capacitor C1 is connected between the resistor R2 and the input end of the second Schmitt trigger IC1B, and the other end of the capacitor C1 is grounded.

The a circuit for filtering narrow pulse and compensating wide pulse is accessed between the PWM signal generator and the inverter unit, and can filter off the narrow pulses in the signal output from the PWM signal generator and allow the normal pulses to pass completely, and the pulses input to the inverter unit all become normal pulses. Thus, the power element IGBT is protected effectively, and the control is more accurate.

The invention claimed is:

1. A circuit for filtering narrow-pulse and compensating wide pulse, the circuit being adapted to be used in a motor controller, and the circuit comprising:
   a) a signal shaping circuit, the signal shaping circuit consisting essentially of a first Schmitt trigger and a first resistor;
   b) a filter circuit, the filter circuit being an RC filter, the RC filter consisting essentially of a second resistor and a first capacitor; and
   c) a pulse width compensating circuit, the pulse width compensating circuit consisting essentially of a second Schmitt trigger, a triode, a third resistor, a fourth resistor, and a second capacitor;
wherein:
   the first resistor is connected between an input end of the first Schmitt trigger and a ground;
   an output end of the first Schmitt trigger is connected to an input end of the RC circuit;
   an output end of the RC circuit is connected to an input end of the second Schmitt trigger;
   the second capacitor and the fourth resistor are connected in series between an output end of the second Schmitt trigger and the ground;
   the third resistor is connected between a base electrode of the triode and a node disposed between the second capacitor and the fourth resistor;
   an emitting electrode of the triode is connected to the ground; and
   a collecting electrode of the triode is connected to the input end of the second Schmitt trigger;
when in use,
   the signal shaping circuit receives an input signal from a signal generator of a motor controller through the input end of the first Schmitt trigger and transmits the input signal to the input end of the RC circuit;
   the RC circuit filters off narrow pulses of the input signal and transmits the input signal from the output end of the RC circuit to the input end of the second Schmitt trigger; and
   the pulse width compensating circuit compensates wide pulses of the input signal and outputs an output signal through the output end of the second Schmitt trigger to an inverter unit of the motor controller.

2. The circuit of claim 1, wherein:
   the pulse width compensating circuit produces a pulse width compensation $T_2$; and
   the pulse width compensation $T_2$ changes according to changes of electric resistances of the second resistor, the third resistor, and the fourth resistor and according to changes of electric capacities of the first capacitor and the second capacitor.

3. A motor controller, comprising a PWM signal generator and an inverter unit, the PWM signal generator comprising a plurality of signal output ends, each of the signal output ends being provided with a circuit for filtering narrow-pulse and compensating wide pulse, an output end of the circuit for filtering narrow-pulse and compensating wide pulse being connected with an input end of the inverter unit, the circuit for filtering narrow-pulse and compensating wide pulse comprising a signal shaping circuit, a filter circuit, and a pulse width compensating circuit, the signal shaping circuit consisting essentially of a first Schmitt trigger and a first resistor, the filter circuit being an RC filter, the RC filter consisting essentially of a second resistor and a first capacitor, the pulse width compensating circuit essentially consisting of a second Schmitt trigger, a triode, a third resistor, a fourth resistor, and a second capacitor,
wherein:
   the first resistor is connected between an input end of the first Schmitt trigger and a ground;
   an output end of the first Schmitt trigger is connected to an input end of the RC circuit;
   an output end of the RC circuit is connected to an input end of the second Schmitt trigger;
   the second capacitor and the fourth resistor are connected in series between an output end of the second Schmitt trigger and the ground;
   the third resistor is connected between a base electrode of the triode and a node disposed between the second capacitor and the fourth resistor;
   an emitting electrode of the triode is connected to the ground; and
   a collecting electrode of the triode is connected to the input end of the second Schmitt trigger;
when in use,
   the signal shaping circuit receives an input signal through the input end of the first Schmitt trigger from the PWM signal generator and transmits the input signal to the input end of the RC circuit;
   the RC circuit filters off narrow pulses of the input signal and transmits the input signal from the output end of the RC circuit to the input end of the second Schmitt trigger; and
   the pulse width compensating circuit compensates wide pulses of the input signal and outputs an output signal through the output end of the second Schmitt trigger to the inverter unit.

4. The circuit of claim 3, wherein:
   the pulse width compensating circuit produces a pulse width compensation $T_2$; and
   the pulse width compensation $T_2$ changes according to changes of electric resistances of the second resistor, the third resistor, and the fourth resistor and according to changes of electric capacities of the first capacitor and the second capacitor.

\* \* \* \* \*